United States Patent [19]

Straemke

[11] Patent Number: 5,072,693

[45] Date of Patent: Dec. 17, 1991

[54] CONDUCTOR PASSAGE AT A VACUUM CONTAINER

[76] Inventor: Siegfried Straemke, Fichtenhain 6, D-5135, Selfkant 4, Fed. Rep. of Germany

[21] Appl. No.: 504,331

[22] Filed: Apr. 3, 1990

[30] Foreign Application Priority Data

Apr. 5, 1989 [DE] Fed. Rep. of Germany .... P3910931

[51] Int. Cl.[5] .............................................. C23C 16/50

[52] U.S. Cl. .................................... 118/715; 118/723; 118/725

[58] Field of Search ................. 118/715, 72g313, 725, 118/733

[56] References Cited

U.S. PATENT DOCUMENTS 3,755,611 8/1973 Queck et al. .

4,820,370 4/1989 Ellenberger ........................ 118/723

FOREIGN PATENT DOCUMENTS 3544250 6/1986 Fed. Rep. of Germany .

*Primary Examiner*—Bueker, Richard

*Attorney, Agent, or Firm*—Spensley Horn Jubas & Lubitz

[57] ABSTRACT

When a specific electric potential is to be applied to a component (11) within a vacuum container, it is required to guide a conductor through a wall of the vacuum container (10). To this purpose, an insulating body (14) must be mounted in the wall (10). If physical or chemical processes within the container lead to separation of conductive material, there is the danger that the insulating body (14) will be coated within the container and that the resulting conductive coating forms a bridge between the conductor (13) and the container 10). For preventing deposit of material on the insulating body (14), a gas flow is generated for sweeping along the wall portions of the insulating body (14).

7 Claims, 2 Drawing Sheets

CONDUCTOR PASSAGE AT A VACUUM CONTAINER

The invention is directed to a conductor passage of the type mentioned in the preamble of claim 1.

In a variety of vacuum processes performed in vacuum containers, it is required to apply an electric potential to components being arranged within the container. This necessitates that the conductor is guided through the wall of the container. If physical or chemical processes occur within the vacuum container which lead to separation of electrically conductive material on the insulating body of the conductor passage, the surface of the insulating body is increasingly coated with conductive material so that a connection is established from the conductor to the container wall via the outer surface of the insulating body.

DE-35 44 250 Al discloses a conductor passage at a precipitation apparatus wherein a gas flow is generated along the insulating body penetrating the container wall. In the region of this gas flow, a venturi portion is arranged in which the gas flows at a heightened speed for preventing deposit of electrically conductive materials on the insulating body. From U.S. Pat. No. 3, 755, 611 there is known—also for a precipitation apparatus—a conductor passage having a porous wall through which a gas is pressed into the container. At the inner side of said porous insulating wall, a protective gas film is generated which permanently regenerates itself and prevents deposit of electrically conductive material on the insulator.

The known conductor passages cannot be used at vacuum containers because in vacuum containers, on maintainance of the vacuum, neither a high-speed gas flow nor a protective gas film can be generated. If little gas is supplied, it is sucked into the vacuum, and if much gas is supplied, the vacuum is nullified.

It is the object of the invention to provide a conductor passage of the type mentioned in the preamble of claim 1 wherein material deposit within the container, bridging the insulating body, is prevented.

According to the invention, this object is solved by the features indicated in the characterizing part of claim 1.

In the conductor passage of the invention, the laminated structure has the effect that gas atoms, which in a vacuum perform linear movements in atomic flow, can hardly or not at all reach the core of the insulating body because, prior thereto, they are captured by the lamellae and condensate thereat. The gas flow hinders the advancing of the metal atoms to the core of the insulating body and thus supports the effect of the small lamellae ways by keeping radially entering metal atoms off the insulating core.

The conductor passage of the invention is particularly suited for vacuum containers wherein vapor-deposition or other coating processes are performed. The conductor passage precludes metal deposit on the insulating body. The fluid flows can be caused by suitable outlet openings on the insulating body or by an overall porous structure of that portion of the insulating body which is arranged within the container. The outlet openings or pores are arranged preferably in the area of surrounding lamellae so that, from the bottom of the annular space formed between the lamellae, a permanent gas flow sweeps along the lamellae. Already because of the labyrinthic geometry, the laminar structure impedes a depositing of particles on the insulating body. By the fact that a radially outward flow is maintained between two lamellae, respectively, depositing of material is rendered impossible.

The lamellae may be made of metal.

Embodiments of the invention will be described in greater detail hereunder with reference to the accompanying drawings.

In the drawings

Figure 1:
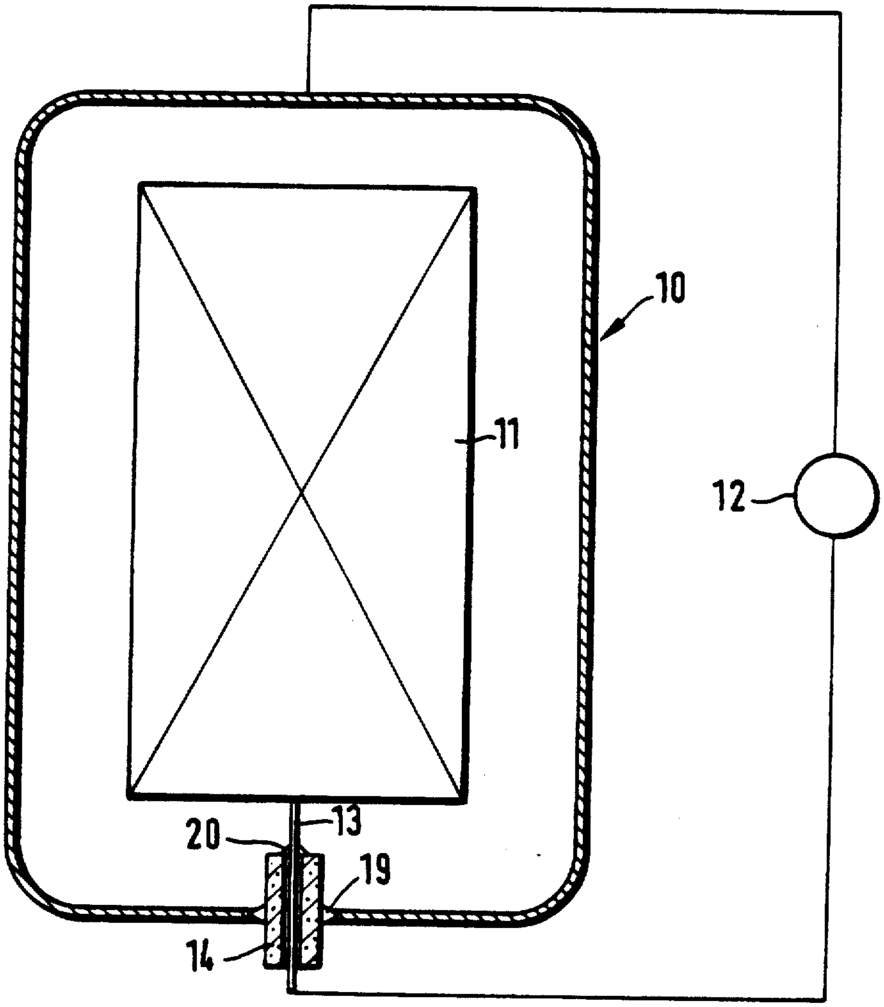
FIG. 1 shows a schematic longitudinal section through a vacuum container.

According to FIG. 1, there is provided a vacuum container 10 for accommodating the batch 11 to be treated. A voltage source 12 is provided outside the container 10, having one pole connected to the container 10 and having its other pole connected to an electric conductor 13 extending from the batch 11 through an insulating body 14. Said insulating body 14 extends sealingly through the wall of container 10. A vacuum pump (not shown) is connected to container 10.

Figure 2:
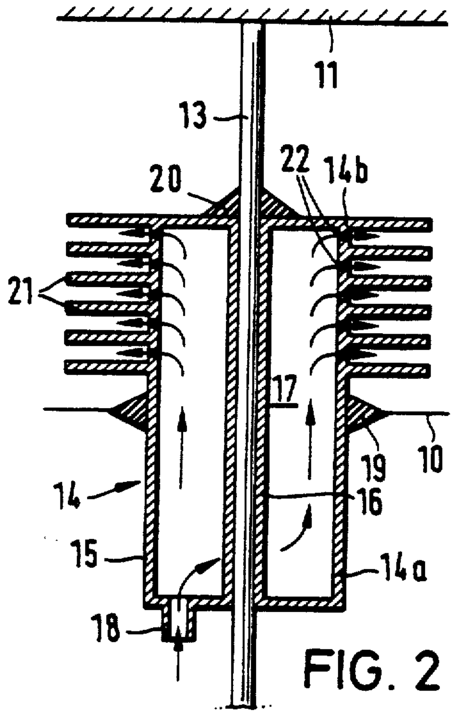
FIG. 2 is a schematic representation, on an enlarged scale, of a first embodiment of the conductor passage having separate outlet openings.

FIG. 2 shows a first embodiment of the conductor passage. In this embodiment, the insulating body 14 consists of an annular hollow body having an outer annular wall 15 and of an inner annular wall 16 tightly enclosing the conductor rod 13. The annular hollow space 17, having its end faces closed, is arranged between the two annular walls 15 and 16. The hollow space 17 is provided with an adapter 18 to be connected to a source of inert gas.

The insulating body 14, in the central area of its length, is inserted in a hole in the wall of container 10. The circumference of the insulating body 14 is sealed against the container wall by a vacuum sealing 19. Thus, the insulating body is provided with a portion 14a outside container 10 and a portion 14b within container 10. Within the container, the passage of conductor rod 13, leading through the annular wall 16, is sealed by an additional vacuum sealing 20.

The portion 14b of insulating body 14 has a plurality of lamellae 21 extending outwardly from the outer annular wall 15 and having gaps arranged therebetween. The lamellae preferably form a labyrinth allowing no optical view onto the core of the insulating body from the outside. At the bottom of each annular gap, openings 22 are formed in the outer annular wall 15 so that gas can penetrate into the gap from hollow space 17. In this manner, permanent radial gas flow is generated in the gaps between the lamellae 21.

If e.g. vaporous metal issues from the batch 11, which metal can deposit in the inner space of vacuum container 10, the gas flow prevents that this material will deposit in the gaps between the lamellae 21. Thus, it is prohibited that a conductive metallic coating, extending from the conductor rod 13 to the container wall 10 and being able to establish an electric connection between these portions, is generated. The insulating body 14 consists of a gas-impermeable non-conductive material, e.g. of ceramics.

Figure 3:
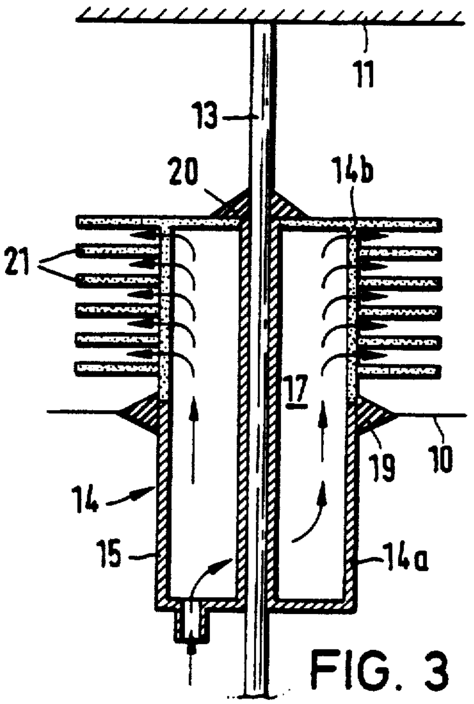
FIG. 3 shows a second embodiment of the conductor passage having a partially porous insulating body.

In the embodiment according to FIG. 3, the insulating body 14 is of the same geometrical arrangement as that of FIG. 2 except for the fact that no holes 22 are provided. The portion 14*b* within container 10 is made of a porous gas-permeable material, e.g. of porous ceramics. However, portion 14*a* outside the container is made of gas-impermeable material. Generally, both portions 14*a* and 14*b* can be fabricated in one piece of the same material, portion 14*a* being provided with a gas-impermeable coating.

In the area of portion 14*b*, gas escapes through the porous material of the outer annular wall 15. This material, flowing radially to the outside through the gaps formed between the lamellae 21, prevents an accumulation of foreign material.

Figure 4:
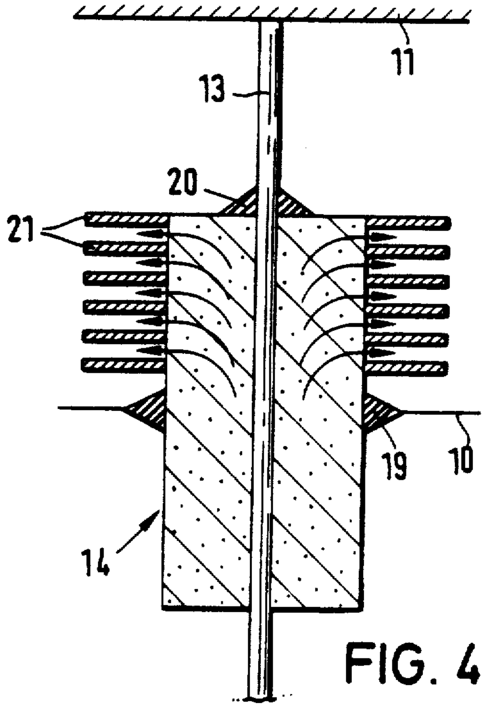
FIG. 4 shows a third embodiment wherein the insulating body is a self-gassing massive body.

In the embodiment of FIG. 4, the insulating body 14 consists of a solid material surrounding the conductor rod 13. This material emits gas in the vacuum so that, between the lamellae 21, there are generated radial gas streams coming out of the insulating body, without a large hollow space being provided within the insulating body. Emission of gas can be accomplished also in that, due to the pressure difference between the surroundings of the vacuum container 10 and the interior of this vacuum container, atmospheric air penetrates through the porous insulating container 10 while flowing at a reduced volume.

The same effect can be obtained by impregnating the insulating body by a gas-emitting material.

I claim:

1. Conductor passage at a vacuum container, with an insulating body sealingly penetrating the wall of the container and having a conductor extending therethrough.

characterized in that the insulating body, at surfaces within the vacuum container, gives off a fluid preventing the deposition of material on said surfaces, and that, within the container, lamellae project from the core of the insulating body, between which lamellae the medium issuing from the insulating body flows to the outside.

2. Conductor passage according to claim 1, wherein the insulating body contains a hollow space which is connectable to a fluid source and is provided with gas outlet openings on the surfaces within the container.

3. Conductor passage according to claim 1, wherein the insulating body contains a hollow space being limited towards the interior of the container by porous walls.

4. Conductor passage according to claim 1, wherein the insulating body consists of a material which, in case of low inner pressure of the container, emits gas into the container.

5. Conductor passage according to claim 1, wherein the lamellae form a labyrinth allowing no optical view onto the core of the insulating body from the outside.

6. Conductor passage according to claim 5, wherein the outlet openings are arranged between the lamellae.

7. Conductor passage according to claim 1, wherein the outlet openings or pores are provided only in the surrounding side wall of the insulating body.

* * * * *